United States Patent
Bhongale et al.

(10) Patent No.: US 10,295,695 B2
(45) Date of Patent: May 21, 2019

(54) HIGH SENSITIVITY ELECTRIC FIELD SENSOR

(71) Applicant: HALLIBURTON ENERGY SERVICES, INC., Houston, TX (US)

(72) Inventors: Satyan Gopal Bhongale, Cypress, TX (US); Tasneem Mandviwala, Katy, TX (US); Etienne Samson, Cypress, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/513,933

(22) PCT Filed: Oct. 17, 2014

(86) PCT No.: PCT/US2014/061091
§ 371 (c)(1),
(2) Date: Mar. 23, 2017

(87) PCT Pub. No.: WO2016/060679
PCT Pub. Date: Apr. 21, 2016

(65) Prior Publication Data
US 2017/0248731 A1 Aug. 31, 2017

Related U.S. Application Data

(63) Continuation of application No. PCT/US2014/061091, filed on Oct. 17, 2014.

(51) Int. Cl.
*G01V 3/28* (2006.01)
*G01R 15/24* (2006.01)
(Continued)

(52) U.S. Cl.
CPC .......... *G01V 3/28* (2013.01); *G01R 15/245* (2013.01); *G01R 29/12* (2013.01); *G01R 33/032* (2013.01); *G01V 3/26* (2013.01); *G01R 15/247* (2013.01)

(58) Field of Classification Search
CPC ... G01V 3/26; G01V 3/28; G01V 3/30; G01R 15/245; G01R 33/032
See application file for complete search history.

(56) References Cited

U.S. PATENT DOCUMENTS 4,502,010 A     2/1985  Kuckes
6,397,946 B1 *  6/2002  Vail, III ............... E21B 7/20
                                                166/250.01
(Continued)

FOREIGN PATENT DOCUMENTS

WO     2014/043073    3/2014

OTHER PUBLICATIONS

PCT International Search Report and Written Opinion, dated Jun. 30, 2015, Appl No. PCT/US2014/061091, "High Sensitivity Electric Field Sensor," Filed Oct. 17, 2014, 14 pgs.

*Primary Examiner* — Walter L Lindsay, Jr.
*Assistant Examiner* — Milton Gonzalez
(74) *Attorney, Agent, or Firm* — John W. Wustenberg; Parker Justiss, P.C.

(57) ABSTRACT

An electric field sensing system comprises a magnetic shield, an optical magnetometer shielded from external magnetic fields by the magnetic shield, a conductive coil proximate to the optical magnetometer, and first and second electrodes coupled to opposite ends of the coil. The electrodes are disposed outside of the magnetic shield. The conductive coil generates a magnetic field within the optical magnetometer when electrical current passes through the conductive coil.

18 Claims, 7 Drawing Sheets

(51) Int. Cl.
*G01V 3/26* (2006.01)
*G01R 29/12* (2006.01)
*G01R 33/032* (2006.01)

(56) References Cited

U.S. PATENT DOCUMENTS

| | | | |
|---|---|---|---|
| 7,466,136 B2* | 12/2008 | Chen | E21B 47/10 |
| | | | 175/50 |
| 2004/0196046 A1 | 10/2004 | Aidan et al. | |
| 2008/0000686 A1 | 1/2008 | Kuckes et al. | |
| 2009/0250213 A1* | 10/2009 | Kalb | E21B 47/0905 |
| | | | 166/255.1 |
| 2010/0225313 A1* | 9/2010 | Blanz | G01R 33/26 |
| | | | 324/303 |
| 2013/0056197 A1* | 3/2013 | Maida | E21B 47/123 |
| | | | 166/250.01 |
| 2013/0341092 A1 | 12/2013 | Hay et al. | |
| 2014/0368201 A1* | 12/2014 | Leblanc | G01V 3/26 |
| | | | 324/339 |
| 2014/0368202 A1* | 12/2014 | San Martin | G01V 3/26 |
| | | | 324/339 |
| 2014/0368203 A1* | 12/2014 | Samson | G01V 3/28 |
| | | | 324/339 |

* cited by examiner

HIGH SENSITIVITY ELECTRIC FIELD SENSOR

BACKGROUND

Electric field sensors are useful for measuring electric field strengths in a variety of contexts. One such context is the downhole environment. In downhole applications, electric field sensors are often used to measure close-proximity electric fields that reflect material properties of the surrounding formation—for example, the depth, thickness, and lateral extent of ore bodies, hydrocarbons, water, and environmental pollutants. Characterizing such material properties is of significant value in terms of maximizing hydrocarbon yield and operational efficiency and minimizing losses due to equipment and environmental damage. Existing techniques for measuring such electric fields, however, are insufficiently insensitive.

For instance, in some enhanced oil recovery efforts, water is injected into a dead well to increase hydrocarbon throughput in an adjacent, producing well. The injected water approaches the producing well in what is called a "water flood," If the water flood crosses a threshold distance from the producing well, the fluid produced by the producing well may become contaminated with the water. Existing techniques for measuring electric fields often fail to detect such water floods until they are too close to the producing well and have already begun to dilute the hydrocarbons that the well produces, resulting in significant financial losses. Similarly, existing electric field sensors are often too insensitive to detect hydrocarbons that are available for extraction from the formation, resulting in substantial opportunity costs. A highly sensitive electric field sensor, therefore, is desirable.

BRIEF DESCRIPTION OF THE DRAWINGS

Accordingly, there are disclosed in the drawings and in the following description various methods and systems that provide a high sensitivity electric field sensor. In the drawings.

Figure 1:
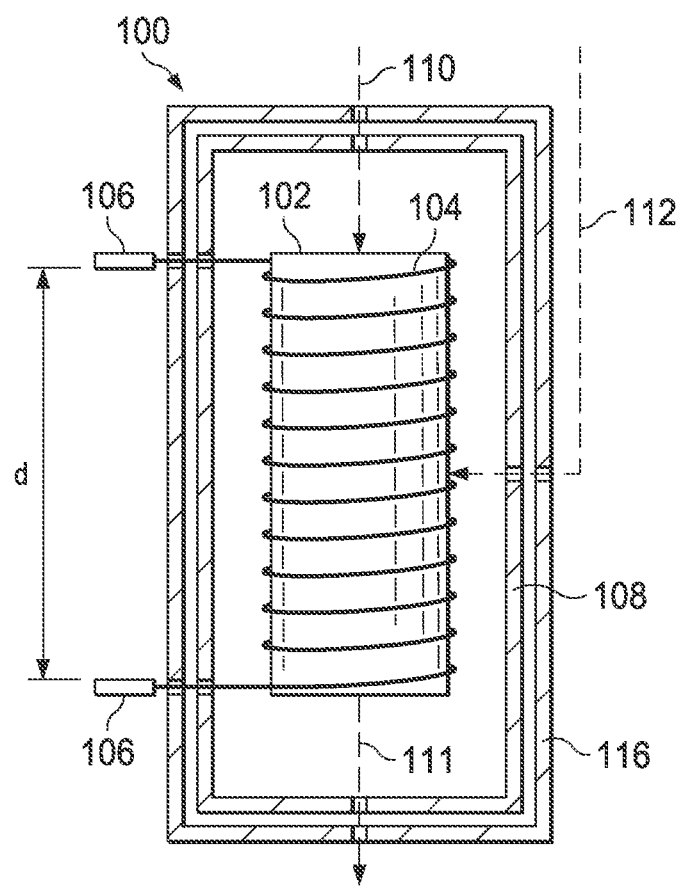
FIG. 1 is a schematic of an illustrative electric field sensor.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein are methods and systems for manufacturing and using a high sensitivity electric field sensor. The electric field sensor comprises a conductive coil wound around an optical magnetometer. The coil and optical magnetometer are housed within a sealed magnetic shield, thereby creating alternate flow paths for magnetic fields external to the magnetic shield and effectively isolating the coil and magnetometer assembly from any such external fields. The sensor further comprises electrodes, coupled to the ends of the coil, that are disposed outside of the magnetic shield and within the electric field to be measured.

In operation, the electric field to be measured generates a potential between the electrodes, which, in turn, induces a current to flow between the electrodes via the coil. When the current passes through the coil, a magnetic field is created within the magnetic shield. The strength of this magnetic field is measured using the optical magnetometer and, because the magnetic field is generated using the electric field to be measured, the strength of the magnetic field is directly related to the strength of the electric field. Accordingly, processing logic uses the strength of the magnetic field to calculate the strength of the electric field. In this way, the high sensitivity of the optical magnetometer is leveraged to obtain high sensitivity electric field measurements.

FIG. 1 is a schematic of an illustrative electric field sensor 100 in accordance with embodiments. The electric field sensor 100 comprises an optical magnetometer 102 and a conductive coil 104 that is proximate to the optical magnetometer 102, meaning that the coil 104 is either wrapped around the magnetometer 102 or is adjacent to, but not wrapped around, the magnetometer 102. The remainder of this discussion assumes embodiments in which the coil is wrapped around the magnetometer, but it also applies to embodiments in which the coil is not wrapped around the magnetometer but is suitably configured and co-located with the magnetometer to generate a magnetic field that the magnetometer can detect. The ends of the conductive coil 104 couple to electrodes 106, which are separated by a distance d. The magnetometer 102 and coil 104 form an assembly that is housed within a sealed magnetic shield 108 and a heat-and pressure-resistant packaging 116 that protects the assembly from excessive downhole pressure. In addition, the optical magnetometer 102 is adapted to receive laser light beams 110 and 112 and to output laser light beam 111, all of which are used to measure the strength of a magnetic field generated within the magnetic shield 108, as described below. The scope of this disclosure is not limited, however, to any particular number of light beams or any particular technique for interrogating the magnetometer. Any suitable technique may be used and falls within the scope of disclosure.

The optical magnetometer 102 is preferably a high-sensitivity magnetometer, such as a spin exchange relaxation free (SERF) magnetometer, although other types of magnetometers—such as scalar and radio frequency magnetometers—also are contemplated and fall within the scope of this disclosure. A SERF magnetometer generally comprises a small-volume glass cell that is filled with a high-density vapor. In some embodiments, the glass cell dimensions are on the order of millimeters and the volume preferably in the range of 8 $mm^3$ to 125 $mm^3$. The glass cell may be cuboidal in shape, although all suitable shapes are contemplated. In general, optical magnetometers encompass a wide range of techniques in which light is used to measure the response of atomic angular momentum to magnetic fields.

In some embodiments, the vapor comprises one or more isotopes of an alkali metal, such as lithium, sodium, potassium, rubidium, cesium, or francium. A buffer gas also may be included. The vapor is generated within the glass cell by heating a liquid or solid form of the alkali metal. When the alkali metal used is potassium, for instance, the temperature used may be approximately 200 degrees Celsius, and this temperature is achieved due to the high temperatures naturally present in downhole environments. The actual temperature used, however, may vary according to the downhole environment, the depth at which the magnetometer is deployed, the characteristics of the heat-resistant packaging 116, and the desired vapor density.

In some embodiments, the optical magnetometer 102 measures a magnetic field using light beams 110 and 112. Specifically, a high-power laser emits circularly polarized laser beam 112 into the alkali vapor present within the magnetometer 102. One laser, when interacting with atoms in the vapor, generates atomic angular momentum. The direction of the angular momentum is related to the direction of the magnetic moment. In the presence of an external magnetic field, the magnetic moment precesses. The second laser detects the precession. In some embodiments, the precession is indicated by the absorption of photons from the second laser. In some embodiments, the precession is indicated by the rotation of polarization of the second laser.

Beam 111 is a modified form of beam 110 that results after the beam 110 passes through the optical magnetometer 102. Two-point measurements or imaging of the magnetic field is done by focusing the output beam 111, which is emitted by the magnetometer 102, onto an array of photodiodes (shown in FIGS. 3b, 4b and 5 and discussed below). In some embodiments where the effect of the magnetic field is the rotation of polarization, a polarization measurement instrument may be used to detect the change in polarization. In some embodiments where photons are absorbed and the absorption is a measure of the magnetic field, photo diodes may be used. The photodiode array then provides information about the magnetic field to processing logic in the form of an electric signal for further processing and to calculate the electric field (also described below). In at least some embodiments, the optical magnetometer 102 does not generate the beam 111; instead, beam 111 is a modified form of beam 110 that results after the beam 110 passes through the optical magnetometer 102. As explained above, the scope of disclosure is not limited to any particular laser interrogation technique described herein. Any and all suitable techniques for interrogating the magnetometer fall within the scope of this disclosure.

The conductive coil 104 comprises any suitable material, such as copper. The parameters of the coil 104—such as metal used, gauge, length L, and the number of turns N wound around the optical magnetometer 102—are selected according to the desired sensitivity profile for a given resistance of the formation adjacent to the sensor 100. Generally (but not as a rule), for a given gauge of coil wire of a particular metal, the greater the resistance of the formation adjacent to the sensor 100, the greater the number of coil turns Nrequired to achieve the same sensitivity level as would be achieved with a less resistive adjacent formation.

The magnetic shield 108 is a sealed container that houses the magnetometer and coil assembly, although the shield 108 may contain apertures (not specifically shown) through which the coil 104 may pass to expose electrodes 106 to the target electric field, as well as apertures through which laser light beams 110, 111, and 112 may pass to perform the magnetometry measurements described above. The shield 108 is sealed—meaning that it is an enclosure that contains no orifices or apertures other than those specifically described—to avoid penetration by magnetic field(s) external to the shield 108, which would interfere with magnetic fields generated by current passing through coil 104. The size of the magnetic shield 108 may vary as desired, but in preferred embodiments—given space restrictions in downhole applications—the shield 108 is of a size that is as small as possible while still permitting the electric field sensor 100 to perform as described herein. In some embodiments, the shield 108 dimensions are on the order of millimeters, sometimes with a volume ranging between 9 mm$^3$ and 216 mm$^3$. Similarly, the shield 108 may be shaped as desired, but in preferred embodiments, the shield 102 is roughly the same shape as the magnetometer 108 and, in some embodiments, is roughly cuboidal. In some embodiments, the magnetic shield 108 may be omitted entirely, particularly in those embodiments in which the strength of the magnetic field generated by the magnetometer and coil assembly is sufficient to preclude significant interference by any background magnetic fields.

In some embodiments, the magnetic shield 108 comprises a high-permeability material, such as mu-metal. Such high-permeability materials are effective for shielding against static or low-frequency magnetic fields because they provide a low reluctance path for magnetic flux. That is, the magnetic shield 108 protects its contents from external magnetic fields by providing a path for the magnetic field lines around the shielded area. The effectiveness of mu-metal shielding decreases with the alloy's permeability. Thus, in some embodiments, the magnetic shield 108 may actually comprise several enclosures, one inside the other, each of which successively reduces magnetic field penetration.

The heat- and pressure-resistant packaging 116 comprises a sealed enclosure, except for apertures through which the coil 104 wires must pass so that electrodes 106 may be disposed in a target electric field and for apertures through which laser light beams 110, 111 and 112 must pass to achieve the magnetometry measurements described above. In some embodiments, the beams 110, 111 and 112 are guided along at least some of their lengths by optical fibers (not specifically shown). Each of the fiber optic cables may couple on one end to the packaging 116 and on the other end to its respective source or destination (such as processing logic located external to the sensor), although any suitable fiber optic cable configuration may be implemented. The packaging 116 has any suitable size, but in preferred embodiments, the size is as small as possible while still permitting the sensor 100 to perform its intended functions. In some embodiments, the dimensions are on the order of millimeters, sometimes yielding a volume ranging between 64 mm$^3$ and 343 mm$^3$. In addition, the packaging 116 may have any suitable shape, although in some embodiments, the packaging 116 is shaped similar to the magnetometer 102 and the magnetic shield 108 (e.g., roughly cuboidal).

The heat- and pressure-resistant packaging 116 comprises an alloy material that is suited to resisting extreme heat and pressure, such as that commonly found in downhole environments. In some embodiments, the alloy used to form the packaging 116 comprises INCONEL®, which is a family of austenitic nickel-chromium-based superalloys and is manufactured by SPECIAL METALS CORPORATION®. When heated, INCONEL® forms a thick, stable, passivating oxide layer that resists corrosion and deformation under high temperatures and pressures.

Figure 2:
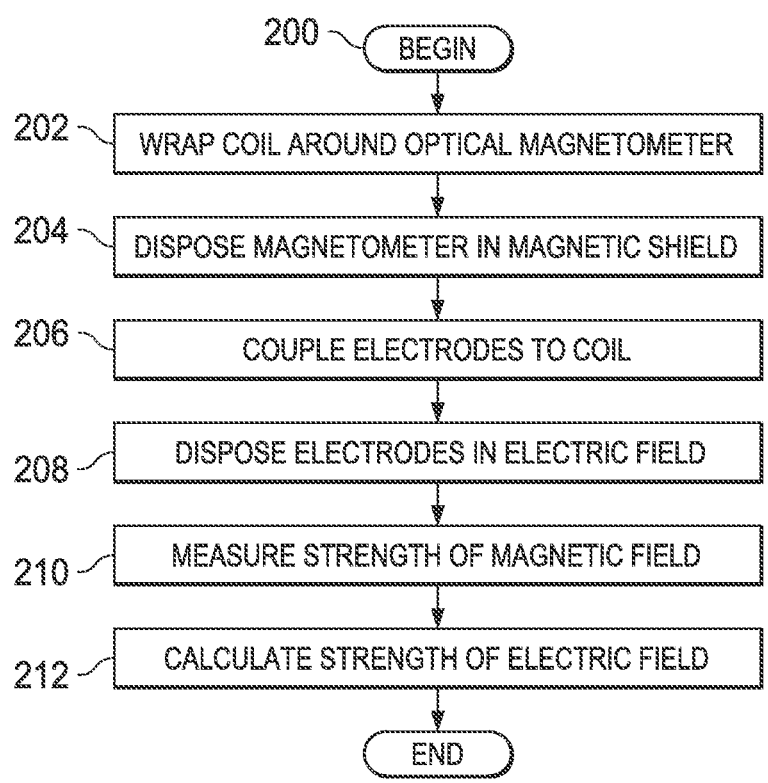
FIG. 2 is a flow diagram of an illustrative method for manufacturing and using an electric field sensor.

FIG. 2 is a flow diagram of an illustrative method 200 for manufacturing and using an electric field sensor. The method 200 comprises wrapping a conductive coil around an optical magnetometer (step 202). The properties and parameters of the conductive coil and optical magnetometer are already described in detail above and, therefore, are not repeated here. The method 200 then comprises optionally disposing the magnetometer within the magnetic shield (step 204). The method 200 also comprises coupling electrodes to the ends of the conductive coil (step 206), and disposing the electrodes within the electric field to be measured (step 208). The electric field sensor 100 has a wide range of potential applications, including—but not limited to—downhole applications. Thus, for example, in step 208 the electrodes may be coupled to the surface of a tool, such as a wireline or drilling tool, while in other embodiments the electrodes may be disposed within a cement slurry that is allowed to set as is well-known in the art. Other dispositions for the electrodes are contemplated depending on the particular application within which the sensor 100 is deployed. The method 200 then comprises measuring the strength of the magnetic field (step 210). The magnetic field may be measured in any suitable manner, but in at least those embodiments in which the optical magnetometer 102 is a SERF magnetometer, multiple laser beams are passed through the magnetometer—as described in detail above—to produce an output beam that indicates the strength of the magnetic field present within the magnetic shield 108.

The method 200 finally comprises using magnetic field measurements to calculate the strength of the electric field (step 212). This step may be performed by processing logic in electrical or optical communication with the electric field sensor 100, examples of which are described below. Such processing logic first calculates the current I passing through the coil 104 according to the equation:

$$I = \frac{BL}{N\mu_0} \quad (1)$$

where I is the current flowing through the coil 104 in amperes, B is the strength of the magnetic field in Tesla, L is the length of the coil 104 in meters, N is the number of turns of the coil 104 around the optical magnetometer 102, and $\mu_0$ is the permeability of free space, which is $4\pi \cdot 10^{-7}$ Henry/meter. The values L, N, and the permeability of free space are known, and the value of B is determined in step 210. Once the current I in the coil 104 has been determined, the processing logic calculates the voltage potential V between the electrodes 106 according to the equation:

$$V = IR \quad (2)$$

where I is the current flowing through the coil 104 in amperes and R is the resistance (in Ohms) that the current I encounters when flowing along coil 104 between the electrodes 106. The current I is calculated with equation (1) and R is known. In some embodiments, is may be beneficial to keep the sensor's input impedance significantly higher than the formation between the electrodes to preserve accuracy. Having determined V, the processing logic then calculates the strength of the electric field $\vec{E}$ within which the electrodes 106 are disposed according to the equation:

$$\vec{E} = \frac{V}{d} \quad (3)$$

where $\vec{E}$ is the strength of the electric field in volts per meter, V is the voltage between the electrodes 106 in volts, and d is the distance between the electrodes 106 in meters.

The calculated electric field strength then may be used as desired. The steps of method 200 may be modified as desired, including the addition, deletion and/or rearrangement of steps. Additionally, the processing logic may be modified to account for various noise effects, environmental effects and manufacturing imperfections.

As the foregoing equations establish a linear relationship between the detected magnetic field B and the measured electric field $\vec{E}$, the processing logic may rely on a simple calibration curve given by the function $f$.

$$\vec{E} = f(B) \quad (4)$$

where $f(B)$, in at least some embodiments, is the magnetic field B multiplied by a calibration constant c. Thus, in some embodiments, equations (1)-(3) are used during the design phase and not during the measurement phase. Equation (4) is used during the measurement phase.

Figure 3A:
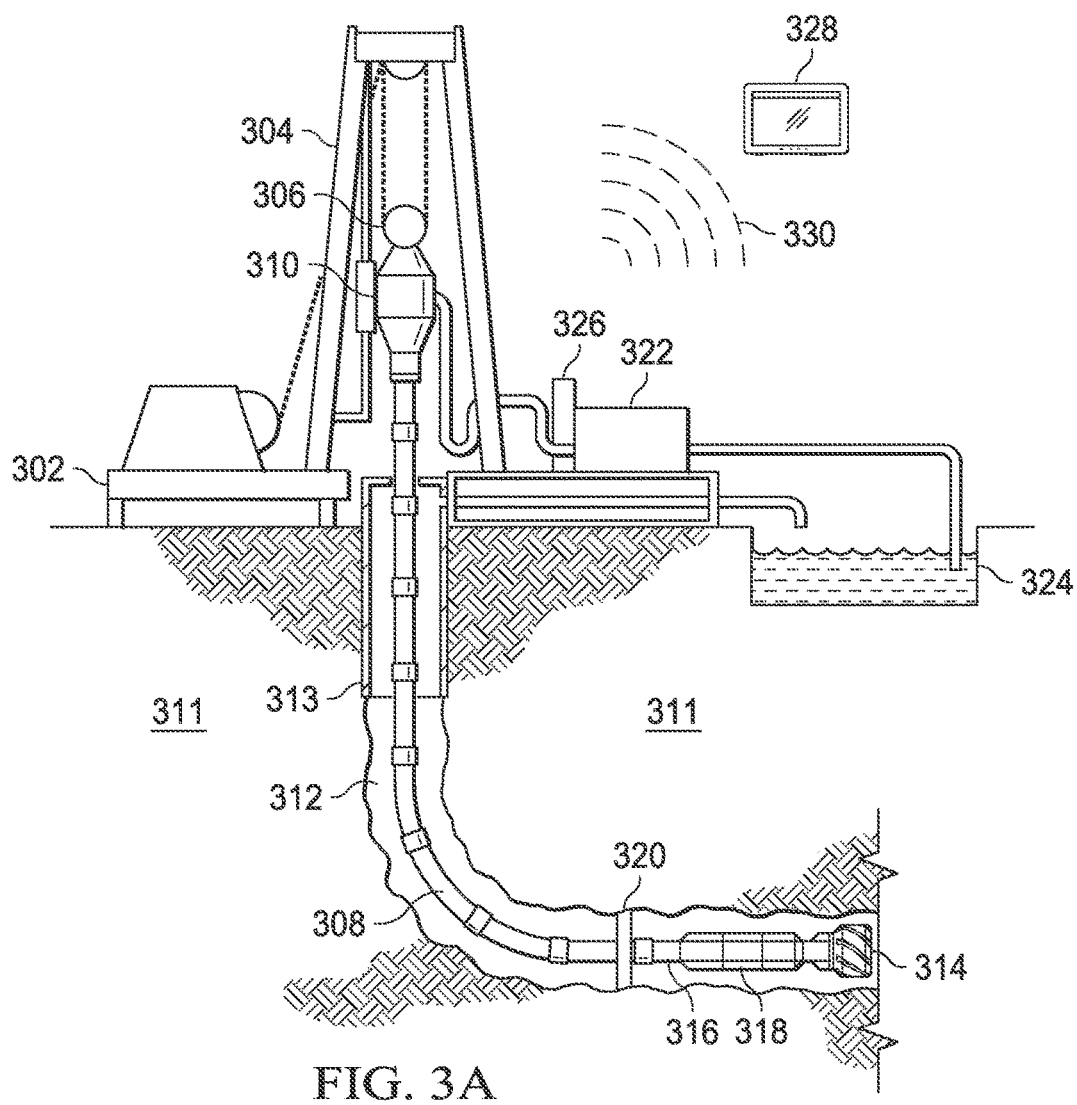
FIG. 3a is a schematic of an illustrative drilling application in which an electric field sensor may be deployed.

The remainder of this description addresses various applications in which the sensor 100 may be deployed. FIG. 3a, for instance, shows an illustrative drilling environment in which the sensor 100 may be deployed. The environment comprises a drilling platform 302 that supports a derrick 304 having a traveling block 306 for raising and lowering a drill string 308. A top-drive motor 310 supports and turns the drill string 308 as it is lowered into the borehole 312 that is formed within formation 311. The drill string's rotation, alone or in combination with the operation of a downhole motor, drives the drill bit 314 to extend the borehole. The drill bit 314 is one component of a bottomhole assembly (BHA) 316 that may further include a rotary steering system (RSS) 318 and stabilizer 320 (or some other form of steering assembly) along with drill collars and logging instruments. A pump 322 circulates drilling fluid through a feed pipe to the top drive 310, downhole through the interior of drill string 308, through orifices in the drill bit 314, back to the surface via the annulus around the drill string 308, and into a retention pit 324. The drilling fluid transports cuttings from the borehole 312 into the retention pit 324 and aids in maintaining the integrity of the borehole. An upper portion of the borehole 312 is stabilized with a casing string 313 and the lower portion being drilled is open (uncased) borehole.

The drill collars in the BHA 316 are typically thick-walled steel pipe sections that provide weight and rigidity for the drilling process. The thick walls are also convenient sites for installing logging instruments that measure downhole conditions, various drilling parameters, and characteristics of the formations penetrated by the borehole. The BHA 316 typically further includes a navigation tool having instruments for measuring tool orientation (e.g., multi-component magnetometers and accelerometers) and a control sub with a telemetry transmitter and receiver. The control sub coordinates the operation of the various logging instruments, steering mechanisms, and drilling motors, in accordance with commands received from the surface, and provides a stream of telemetry data to the surface as needed to communicate relevant measurements and status information. A corresponding telemetry receiver and transmitter is located on or near the drilling platform 302 to complete the telemetry link. The most popular telemetry link is based on modulating the flow of drilling fluid to create pressure pulses that propagate along the drill string ("mud-pulse telemetry or MPT"), but other known telemetry techniques are suitable. Much of the data obtained by the control sub may be stored in memory for later retrieval, e.g., when the BHA 316 physically returns to the surface.

A surface interface 326 serves as a hub for communicating via the telemetry link and for communicating with the various sensors and control mechanisms on the platform 302. A data processing unit (shown in FIG. 3a as a tablet computer 328) communicates with the surface interface 326 via a wired or wireless link 330, collecting and processing measurement data to generate logs and other visual representations of the acquired data and the derived models to facilitate analysis by a user. The data processing unit may take many suitable forms, including one or more of: an embedded processor, a desktop computer, a laptop computer, a central processing facility, and a virtual computer in the cloud. In each case, software on a non-transitory information storage medium may configure the processing unit to carry out the desired processing, modeling, and display generation.

Figure 3B:
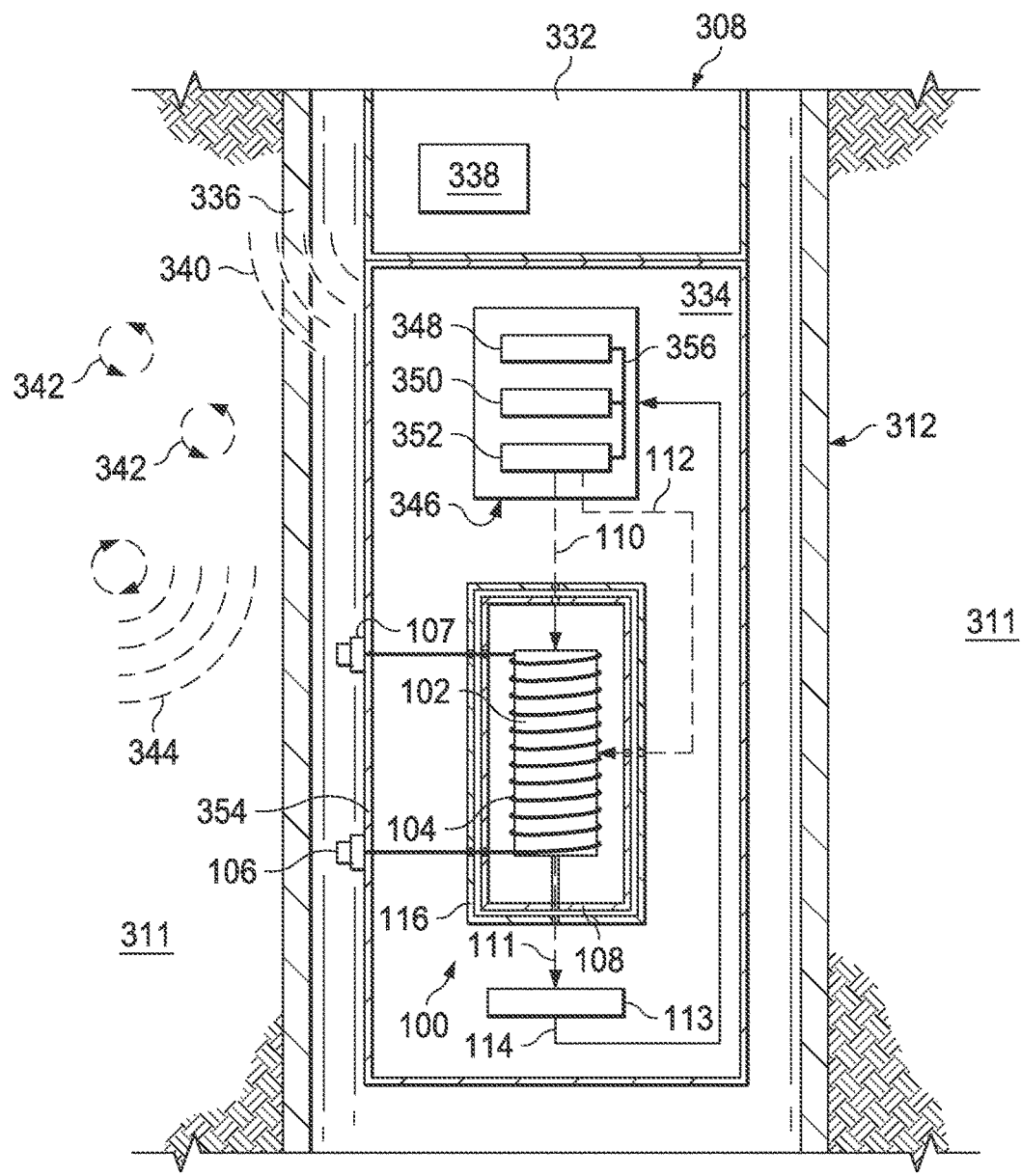
FIG. 3b is a schematic providing a detailed view of an illustrative drilling application in which an electric field sensor may be deployed.

FIG. 3b shows a detailed view of a portion of the drill string 308 disposed within the borehole 312 having a wall 336. As shown, the drill string 308 comprises multiple subs, including subs 332 and 334. The sub 332 comprises a transmitter 338, and the sub 334 comprises the sensor 100 described above. Although FIG. 3b shows the transmitter 338 being disposed in a sub above that of the sensor 100, in some embodiments, the transmitter 338 sub is below the sensor 100 sub, and in still other embodiments, the transmitter 338 and sensor 100 are housed within a single sub.

Still referring to FIG. 3b, the sensor 100 couples to additional equipment that, in at least some embodiments, is housed within the sub 334. Such additional equipment includes a control logic 346 that comprises processing logic 348, storage 350 and laser light source 352. The processing logic 348 is any suitable type of logic that is capable of executing software (e.g., stored on the storage 350) to perform the methods described herein. In some embodiments, the processing logic 348 performs the functions described herein not due to execution of software on storage 350 but as a result of receiving communications from other processing logic (e.g., the control sub) located external to the sub 334. The laser light source 352 comprises any suitable light source for generating the laser beams 110, 112 described above. In some embodiments, the laser light source 352 comprises a high power diode laser for generating the laser beam 112 and a single frequency diode laser for generating laser beam 110. Other types of laser equipment are contemplated and fall within the scope of this disclosure—for example, some magnetometer systems may require more than two laser beams. A bus 356 couples the processing logic 348, the storage 350 and the laser light source 352 so that the processing logic 348 is able to access and execute software code stored on the storage 350 and is able to control the laser light source 352. In addition, the sub 334 comprises a photodiode array 113 that receives laser light beam 111 emitted from the optical magnetometer 102 and provides an electrical signal 114 to the control logic 346 for processing. Further, electrodes 106 couple to an exterior wall 354 of the drill string 308. Because the drill string body may in some embodiments be conductive, the electrodes 106 may optionally couple to the drill string body via insulating pads 107.

Still referring to FIG. 3b, in operation, the transmitter 338—which in some embodiments is controlled by processing logic (not specifically shown) housed within the sub 332 or elsewhere in the drill string 308—emits electromagnetic waves 340 toward an area of the formation 311 desired to be studied. In FIG. 3b, at least some of the transmitted signal 340 propagates in the direction of the borehole wall 336 and formation 311 as shown. The magnetic field generated by the transmitter 338 induces secondary currents 342 within conductive portions of the formation 311. In turn, these secondary currents 342 generate a secondary electromagnetic field 344 within which the electrodes 106 of the sensor 100 are disposed.

The electromagnetic field 344 comprises a magnetic field and an electric field. The electric field creates a potential between electrodes 106. This potential induces current flow along the coil 104 and around the optical magnetometer 102. The current flow in the coil 104 generates a magnetic field within the magnetic shield 108, as explained in detail above. The magnetic shield 108 precludes magnetic fields external to the shield 108 from interfering with the field that coil 104 generates within the shield 108. Processing logic 348 then triggers the laser light source 352 to emit laser light beams 110 and 112, which interact with the optical magnetometer 102 as described in detail above. The optical magnetometer 102 outputs laser beam 111, the characteristics of which indicate the strength of the magnetic field generated by the coil 104. The laser beam 111 strikes photodiode array 113, which converts the laser beam 111 to electrical signal 114. The electrical signal 114 reflects the strength of the magnetic field within the shield 108 as measured by the optical magnetometer 102.

The processing logic 348 then receives the electrical signal 114 and—because the strength of the magnetic field within the shield 108 relates directly to the strength of the electric field within which the electrodes 106 are disposed—it converts the strength of the magnetic field into a strength of the electric field. Specifically, in some embodiments, the processing logic 348 first calculates the current I passing through the coil 104 according to equation (1), set forth above with respect to FIG. 2. Once the current I in the coil 104 has been determined, the processing logic 348 calculates the voltage potential V between the electrodes 106 according to equation (2), also set forth above. Having determined V, the processing logic 348 then calculates the strength of the electric field $\vec{E}$ within which the electrodes 106 are disposed according to equation (3), also set forth above. The calculated electric field strength then may be used as desired. As explained above, in other embodiments, equations (1)-(3) are used in the design phase, and only equation (4) is implemented by the processing logic.

Figure 4A:
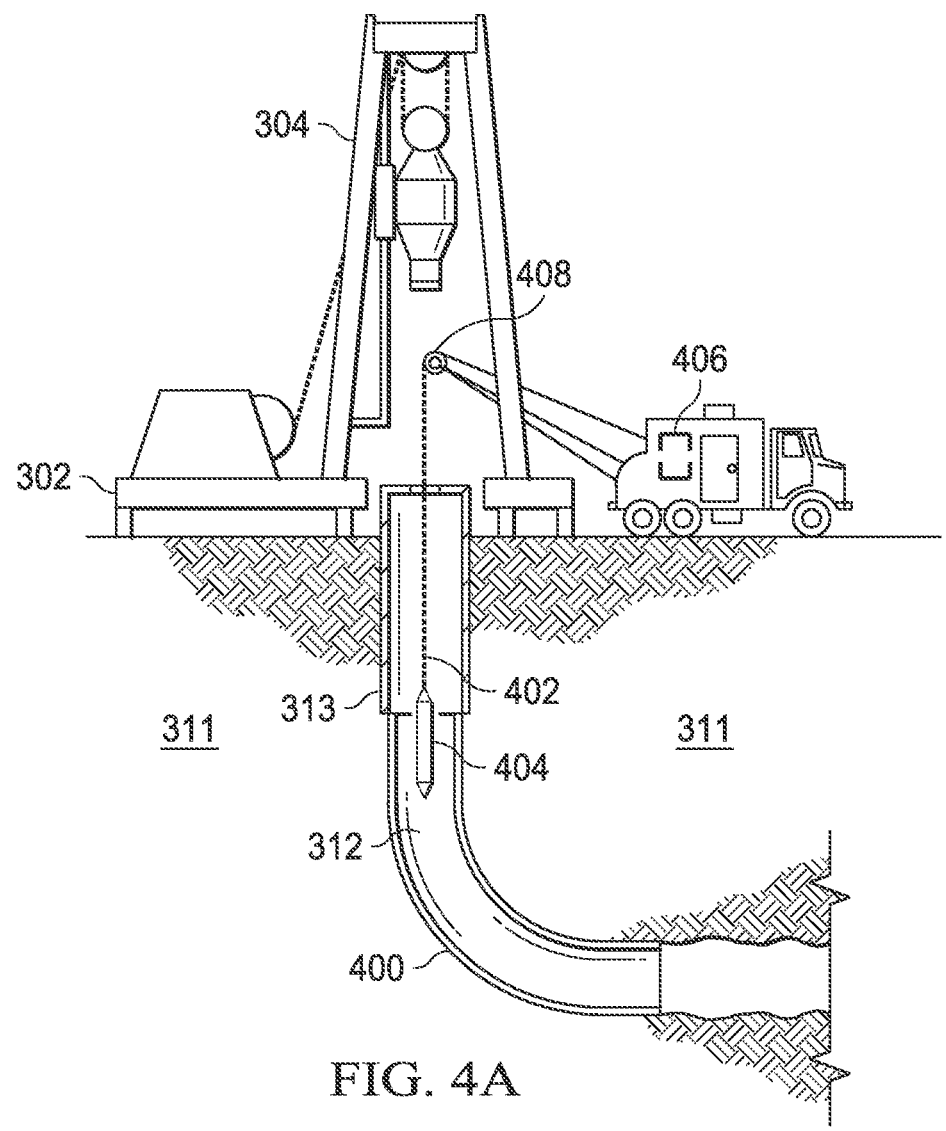
FIG. 4a is a schematic of an illustrative wireline application in which an electric field sensor may be deployed.

FIG. 4a shows the environment of rig 304 during a wireline operation being conducted after a second casing string 400 has been deployed into the borehole 312. A wireline cable 402 suspends a wireline logging tool 404 in the borehole and couples the tool to a processing unit 406. A pulley 408 (shown as affixed to wireline truck boom, but alternatively affixed to the rig 304) enables the wireline truck winch to convey the wireline logging tool 400 along the borehole at a controlled speed. The wireline cable includes electrical and/or optical conductors for transporting measurement data to the processing unit 406 and optionally conveying electrical power to the tool 404. In some embodiments, the logging tool 404 may have pads and/or centralizing members to maintain the tool near the axis of the borehole as the tool is pulled uphole. The processing unit 406 collects measurements from the logging tool 404, storing and processing the measurements. Software stored on a non-transitory information storage medium may configure the processing unit 406 to carry out the desired data acquisition, storage, and processing, alone or in cooperation with a central processing facility having access to the data acquired during the drilling process.

Figure 4B:
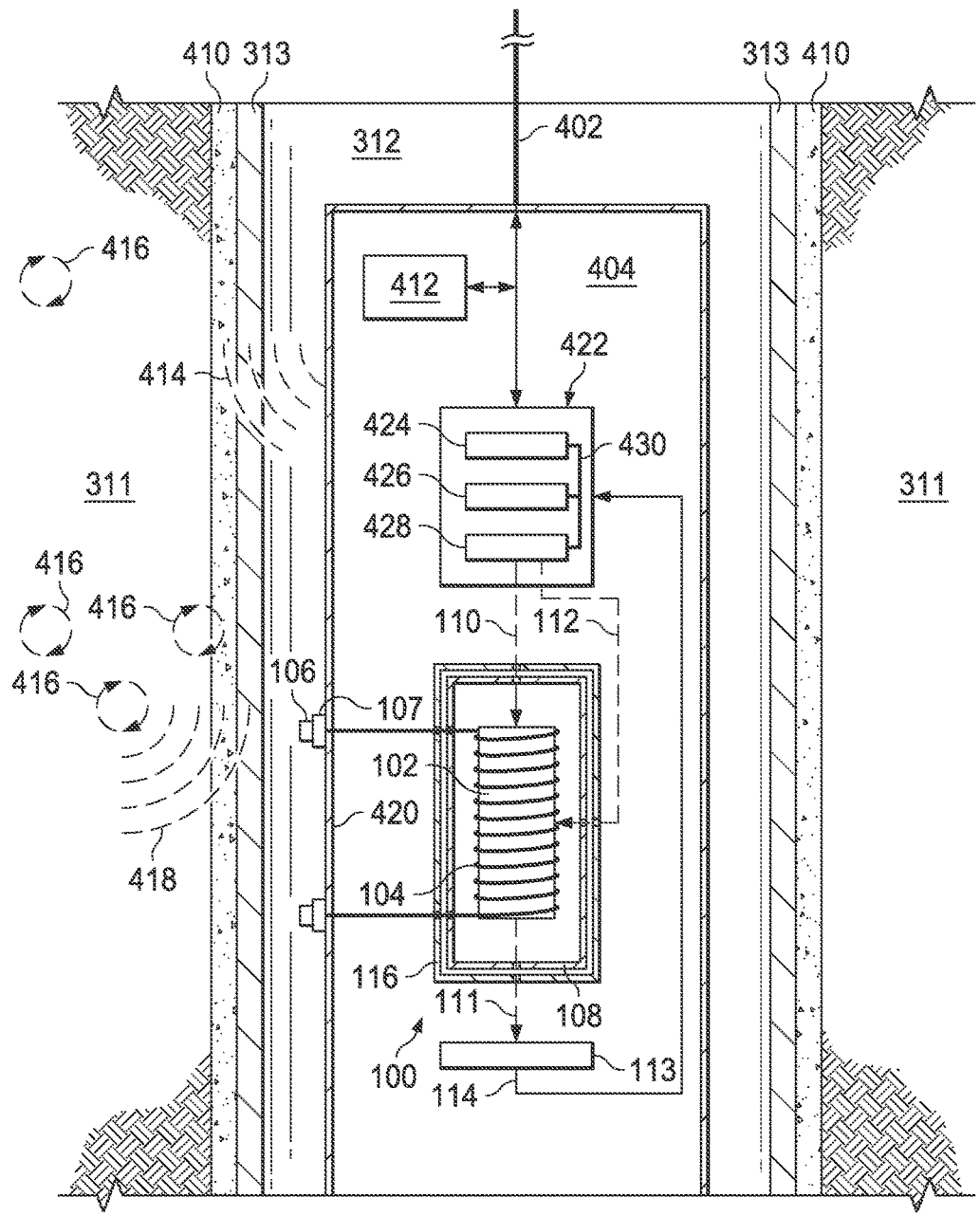
FIG. 4b is a schematic providing a detailed view of an illustrative wireline application in which an electric field sensor may be deployed.

FIG. 4*b* shows a detailed view of a portion of the wireline tool 404. The tool 404 comprises a transmitter 412, the electric field sensor 100, control logic 422, and a photodiode array 113. The control logic 422 comprises processing logic 424, storage 426 (to store, for instance, software that, when executed by processing logic 424, performs some or all of the methods described herein), and laser light source 428, all of which couple via a bus 430. As with the application shown in FIG. 3*b*, the processing logic 424 may perform some or all of the actions described herein by executing software stored on storage 426 or, alternatively, as a result of communications received from another processing logic (e.g., the processing unit 406 shown in FIG. 4*a*). In other embodiments, the processing unit 406 performs the actions described herein in lieu of the processing logic 424. In addition to the foregoing, FIG. 4*b* shows a layer of cement 410 or other suitable material between the casing 313 and the formation 311.

The application shown in FIG. 4*b* operates in much the same way as the application shown in FIG. 3*b*. Transmitter 412, which—in some embodiments—is controlled by processing unit 406, emits electromagnetic waves 414 toward an area of the formation 311 desired to be studied. The magnetic field generated by the transmitter 412 induces secondary currents 416 within conductive features in the formation 311. In turn, the secondary currents 416 generate an electromagnetic field 418 in the vicinity of the electrodes 106, which—in at least some embodiments—are disposed on an outer wall 420 of the wireline tool 404, as shown. Because the wireline tool 404 may be conductive, insulating pads 107 may optionally be used to insulate the electrodes 106 from the tool body.

The electromagnetic field generated by the secondary currents 416 creates an electric potential between electrodes 106. This potential induces current flow in the coil 104 between the electrodes 106. In turn, this current generates a magnetic field within the magnetic shield 108. The laser light source 428 generates laser beams 110, 112 as previously described in detail, causing the optical magnetometer 102 to produce an output laser beam 111 indicative of the strength of the magnetic field generated by the current flowing between the electrodes 106. The photodiode array 113 converts the laser beam 111 into an electrical signal 114 that indicates the strength of the magnetic field. The processing logic 424 receives the signal 114 and, using the strength of the magnetic field, determines a strength of the electric field within which the electrodes 106 are disposed using equations (1)-(3). Alternatively, the processing logic 424 determines the strength of the electric field using only equation (4).

Figure 5:
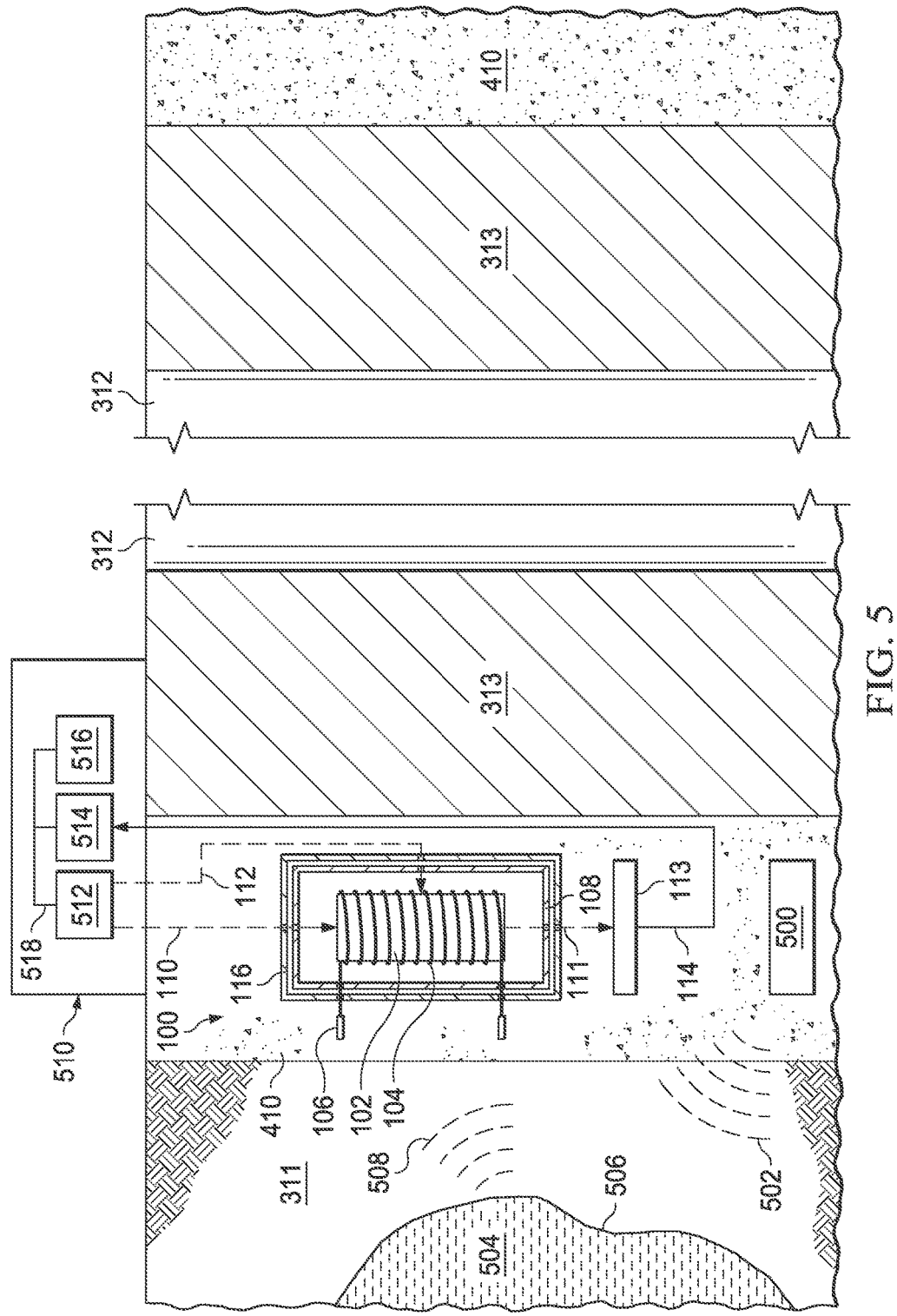
FIG. 5 is a schematic of a permanent installation application of an electric field sensor.

FIG. 5 shows another application in which the electric field sensor 100 may be deployed. Specifically, in this permanent application, the sensor 100 is deployed within a cement layer 410. The sensor 100 may be installed within the layer 410 using any known technique for installing tools within cement layers behind borehole casing. FIG. 5 includes a control logic 510 that comprises laser light source 512, processing logic 514 and storage 516, which couple via bus 518. As with the applications shown in FIGS. 3*b* and 4*b*, the processing logic may use software stored within storage 516 to perform some or all of the actions described herein. Alternatively, the processing logic 514 may perform such actions as a result of communications received from another computer. The sensor 100 comprises electrodes 106 disposed within the cement layer 410, although the electrodes 106 may be disposed in any suitable location, the electric field of which must be measured. Additionally, the cement layer 410 comprises a transmitter 500, although the transmitter 500 may be positioned in any suitable area. Further, in at least some embodiments, light beams 110 and 112 may be provided to and light beam 111 may be provided by the sensor with the use of fiber optic cables. The cables may couple to the packaging 116 on one end and to the light source 512 and/or processing logic 514 on the other end, although any suitable configuration for the fiber optic cables is contemplated. Such cables may be used in any embodiment or application disclosed herein.

Operation of the application shown in FIG. 5 is similar to the operations of the applications shown in FIGS. 3*b* and 4*b*. The transmitter 500 generates an electromagnetic signal 502. The signal 502 may be directed toward a target area of interest—in FIG. 5, water flood 504 having a water boundary 506. The water boundary 506 reflects at least some of the signal 502 as reflected signal 508. This generates an electric field in the vicinity of the electrodes 106. The electric field creates a potential between the electrodes 106, which induces a current to flow through the coil 104. The current, in turn, generates a magnetic field within the shield 108. The sensor 100 then operates as described above; namely, by using the optical magnetometer 102 and laser beams 110, 112 emitted by laser light source 512 to measure the strength of the magnetic field. The photodiode array 113 converts the laser beam 111 output by the magnetometer 102 into an electrical signal 114, which is provided to processing logic 514. In some embodiments, a polarization measurement instrument may be used in conjunction with or in lieu of the photodiode array 113, as may be suitable. The processing logic 514 receives the signal 114—which reflects the strength of the magnetic field within the shield 108—and uses it to calculate the strength of the electric field within which the electrodes 106 are disposed using equations (1)-(3), or alternatively, using only equation (4).

Although the embodiments shown in FIGS. 3*b* and 4*b* determine the strengths of electric fields generated by secondary currents in conductive formations, they may also be used to detect and characterize other objects of interest, such as water floods. Similarly, permanent installation embodiments, such as that shown in FIG. 5, may be used to characterize—without limitation—conductive formations using secondary currents, as shown in FIGS. 3*b* and 4*b*. Furthermore, although FIGS. 3*b*, 4*b* and 5 show single transmitter-detector systems, any number of transmitters and sensors may be deployed as necessary for the particular application in question. Moreover, the electric field sensor 100 described herein is not limited to downhole applications. To the contrary, it may be used to measure the strength of any electric field with a high degree of sensitivity.

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

The following is claimed:

1. An electric field sensing system, comprising:
   a magnetic shield;
   an optical magnetometer shielded from all external magnetic fields by the magnetic shield;
   a conductive coil proximate to the optical magnetometer, the conductive coil generating a magnetic field within the optical magnetometer when electrical current passes through the conductive coil; and first and second electrodes coupled to opposite ends of the coil, the first and second electrodes disposed outside of the magnetic shield.

2. The system of claim 1, further comprising a package that houses the optical magnetometer and protects the optical magnetometer from the effects of pressure.

3. The system of claim 1, further comprising processing logic that uses one or more lasers in conjunction with the optical magnetometer to determine a strength of the magnetic field generated by the coil.

4. The systems of claim 3, wherein the processing logic uses the strength of the magnetic field to determine a strength of an electric field within which said electrodes are disposed.

5. The systems of claim 4, wherein the processing logic determines the strength of the electric field using the strength of the magnetic field, a number of turns associated with the coil, a length associated with the coil, a current associated with the coil, a resistance associated with the coil, and a distance between the electrodes within the electric field.

6. The system of claim 1, wherein the optical magnetometer is selected from the group consisting of: a scalar magnetometer, a spin exchange relaxation free (SERF) magnetometer, and a radio frequency (RF) magnetometer.

7. A downhole system, comprising:
a transmitter to transmit electromagnetic signals toward an adjacent formation;
a magnetic shield housing a conductive coil wound around an optical magnetometer, the magnetic shield shields the conductive coil and the optical magnetometer from all magnetic fields external to the shield; and
multiple electrodes coupled to the coil and disposed within an electric field, the electric field generated as a result of the transmitted electromagnetic signals;
wherein, as a result of a voltage differential generated due to the electric field, a current flows through the coil and generates a magnetic field within the magnetic shield.

8. The downhole system of claim 7, wherein the downhole system comprises either a drill string or a wireline tool.

9. The downhole system of claim 7, wherein the magnetic shield is disposed between a borehole casing and a formation.

10. The downhole system of claim 7, wherein a strength of the electric field reflects a distance between a water flood boundary and at least one of said electrodes.

11. The downhole system of claim 7, wherein the electric field is generated at least in part by secondary currents in a formation adjacent to the multiple electrodes, the secondary currents generated by said transmitted electromagnetic signals.

12. The downhole system of claim 7, further comprising a package housing the optical magnetometer that protects the optical magnetometer from the effects of pressure.

13. The downhole system of claim 7, further comprising processing logic that determines a strength of the magnetic field and that uses said strength of the magnetic field to determine a strength of said electric field.

14. The downhole system of claim 7, wherein the optical magnetometer comprises a spin exchange relaxation free (SERF) magnetometer.

15. A method of manufacturing an electric field sensor, comprising:
winding a conductive coil around an optical magnetometer;
disposing the optical magnetometer and conductive coil within a magnetic shield that shields the optical magnetometer and conductive coil from all magnetic fields external to the shield;
coupling electrodes to the conductive coil; and
disposing said electrodes external to the magnetic shield.

16. The method of claim 15, wherein the optical magnetometer is selected from the group consisting of: a scalar magnetometer, a spin exchange relaxation free (SERF) magnetometer, and a radio frequency (RF) magnetometer.

17. The method of claim 15, further comprising adapting the magnetic shield to permit laser light to enter the optical magnetometer from multiple directions.

18. The method of claim 15, further comprising coupling insulating pads to said electrodes.

* * * * *

UNITED STATES PATENT AND TRADEMARK OFFICE
CERTIFICATE OF CORRECTION

PATENT NO. : 10,295,695 B2
APPLICATION NO. : 15/513933
DATED : May 21, 2019
INVENTOR(S) : Saytan Gopal Bhongale, Tasneem Mandviwala and Etienne Samson It is certified that error appears in the above-identified patent and that said Letters Patent is hereby corrected as shown below:

In the Specification

In Column 3, Line 55, after --turns-- delete "Nrequired" and insert --N required--

In Column 8, Line 37, after --potential-- delete "Vbetween" and insert --V between--

Signed and Sealed this
Seventeenth Day of September, 2019

Andrei Iancu
*Director of the United States Patent and Trademark Office*